(12) United States Patent
Li

(10) Patent No.: US 11,320,700 B2
(45) Date of Patent: May 3, 2022

(54) PANEL STRUCTURE, DISPLAY DEVICE, AND ALIGNMENT DETECTION METHOD OF PANEL STRUCTURE

(71) Applicant: Hubei Yangtze Industrial Innovation Center Of Advanced Display Co., Ltd., Wuhan (CN)

(72) Inventor: Jiaxin Li, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 23 days.

(21) Appl. No.: 17/096,632

(22) Filed: Nov. 12, 2020

(65) Prior Publication Data
US 2022/0066268 A1    Mar. 3, 2022

(30) Foreign Application Priority Data
Aug. 31, 2020 (CN) .......................... 202010898720.X

(51) Int. Cl.
| | | |
|---|---|---|
| *H01L 27/32* | (2006.01) | |
| *G02F 1/1337* | (2006.01) | |
| *H01L 23/544* | (2006.01) | |

(52) U.S. Cl.
CPC ...... *G02F 1/133711* (2013.01); *H01L 23/544* (2013.01); *H01L 27/3265* (2013.01); *H01L 2223/54426* (2013.01)

(58) Field of Classification Search
CPC ............ G02F 1/133711; H01L 23/544; H01L 27/3265; H01L 2223/54426
See application file for complete search history.

(56) References Cited

U.S. PATENT DOCUMENTS

2021/0335856 A1* 10/2021 Li ........................... H01L 21/84

FOREIGN PATENT DOCUMENTS

| CN | 109118954 A | 1/2019 |
|---|---|---|
| CN | 110515492 A | 11/2019 |

* cited by examiner

*Primary Examiner* — Donald L Raleigh
(74) *Attorney, Agent, or Firm* — Anova Law Group, PLLC

(57) ABSTRACT

A panel structure, a display device, and an alignment detection method for the panel structure are provided in the present disclosure. The panel structure includes a first substrate and a second substrate which are oppositely disposed, and further includes a capacitor group including a first capacitor and a second capacitor. The first capacitor includes a first A electrode and a first B electrode which are oppositely disposed; the second capacitor includes a second A electrode and a second B electrode which are oppositely disposed; the first A electrode and the second A electrode are on the first substrate, and the first B electrode and the second B electrode are on the second substrate; the first B electrode is misaligned with the first A electrode along a first direction; and the second B electrode is misaligned with the second A electrode along an opposite direction of the first direction.

20 Claims, 11 Drawing Sheets

PANEL STRUCTURE, DISPLAY DEVICE, AND ALIGNMENT DETECTION METHOD OF PANEL STRUCTURE

CROSS-REFERENCE TO RELATED APPLICATION

This application claims the priority of Chinese Patent Application No. 202010898720.X, filed on Aug. 31, 2020, the content of which is incorporated herein by reference in its entirety.

TECHNICAL FIELD

The present disclosure generally relates to the field of display technology and, more particularly, relates to a panel structure, a display device, and an alignment detection method of the panel structure.

BACKGROUND

In the existing display technology, a panel structure may include a plurality of film layers or substrates which need to be aligned and bonded. The alignment accuracy may directly affect the display performance of the panel structure. Therefore, the substrate bonding process of the panel structure may be detected at the factory stage. Currently, a camera may be configured to perform the detection of the bonding process.

However, due to the depth of field and field of view of the camera's lens, each photo-sensitive unit may only receive a significantly small portion of light, and the light reflected by each point of an alignment mark may be received by a plurality of photo-sensitive units, which may cause the contrast of the boundary of the alignment mark to be low, thereby limiting the precision of the lens alignment.

SUMMARY

One aspect of the present disclosure provides a panel structure. The panel structure includes a first substrate and a second substrate, oppositely disposed; and a capacitor group, including a first capacitor and a second capacitor. The first capacitor includes a first A electrode and a first B electrode, oppositely disposed; the second capacitor includes a second A electrode and a second B electrode, oppositely disposed; the first A electrode and the second A electrode are on the first substrate, and the first B electrode and the second B electrode are on the second substrate; and the first B electrode is misaligned with the first A electrode along a first direction; and the second B electrode is misaligned with the second A electrode along an opposite direction of the first direction.

Another aspect of the present disclosure provides a display device, including a panel structure. The panel structure includes a first substrate and a second substrate, oppositely disposed; and a capacitor group, including a first capacitor and a second capacitor. The first capacitor includes a first A electrode and a first B electrode, oppositely disposed; the second capacitor includes a second A electrode and a second B electrode, oppositely disposed; the first A electrode and the second A electrode are on the first substrate, and the first B electrode and the second B electrode are on the second substrate; and the first B electrode is misaligned with the first A electrode along a first direction; and the second B electrode is misaligned with the second A electrode along an opposite direction of the first direction.

Another aspect of the present disclosure provides an alignment detection method of a panel structure. The method includes providing the panel structure including a first substrate and a second substrate, oppositely disposed; and a capacitor group, including a first capacitor and a second capacitor. The first capacitor includes a first A electrode and a first B electrode, oppositely disposed; the second capacitor includes a second A electrode and a second B electrode, oppositely disposed; the first A electrode and the second A electrode are on the first substrate, and the first B electrode and the second B electrode are on the second substrate; and the first B electrode is misaligned with the first A electrode along a first direction; and the second B electrode is misaligned with the second A electrode along an opposite direction of the first direction. The method further includes detecting each capacitance value of the first capacitor and the second capacitor; and determining an alignment situation of the first substrate and the second substrate according to a detection result.

Other aspects of the present disclosure can be understood by those skilled in the art in light of the description, the claims, and the drawings of the present disclosure.

BRIEF DESCRIPTION OF THE DRAWINGS

Drawings incorporated in the specification and forming a part of the specification demonstrate the embodiments of the present disclosure and, together with the specification, describe the principles of the present disclosure.

DETAILED DESCRIPTION

Figure 1:
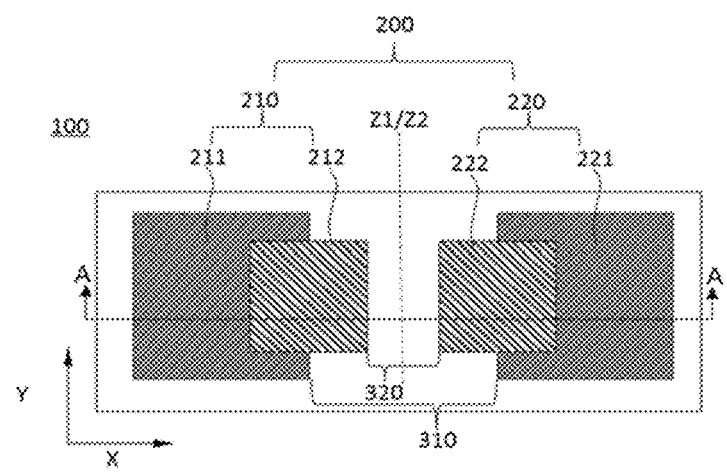
FIG. 1 illustrates a top view of a panel structure according to various embodiments of the present disclosure.

In order to clearly illustrate the above-mentioned objectives, features and advantages of the present disclosure, the present disclosure is further described below with reference to the accompanying drawings and embodiments.

It should be noted that specific details are set forth in the following description in order to fully understand the present disclosure. However, the present disclosure can be implemented in various other ways different from those described herein, and those skilled in the art can make similar generalizations without departing from the connotation of the present disclosure. Therefore, the present disclosure is not limited by the specific embodiments disclosed below.

The terms used in the embodiments of the present disclosure are only for the purpose of describing specific embodiments and are not intended to limit the present disclosure. The singular forms of "a", "said" and "the" used in the embodiments of the present disclosure and the appended claims are also intended to include plural forms, unless the context clearly indicates other meanings.

It should be noted that the "up", "down", "left" and "right" described in the embodiments of the present disclosure are described from the viewing-angle shown in the drawings and should not be understood as a limitation to the embodiments of the present disclosure. Furthermore, in the context, it should also be understood that when it is mentioned that an element is formed "on" or "under" another element, it can not only be directly formed "on" or "under" the other element, but also be indirectly formed "on" or "under" another element through an intermediate element.

Moreover, the example embodiments can be implemented in various forms, and should not be construed as being limited to the embodiments herein; on the contrary, providing such embodiments makes the present disclosure more comprehensive and complete, and fully conveys the concept of the example embodiments to those skilled in the art. The same reference numerals in the figures indicate the same or similar structures, and thus their repeated description may be omitted. The words expressing position and direction described in the present disclosure are all illustrated by taking the drawings as examples, but they can also be changed as needed, and the changes are all included in the protection scope of the present disclosure. The drawings of the present disclosure are only used to illustrate the relative position relationship, and the layer thicknesses of certain parts may adopt an exaggerated drawing method to facilitate understanding. The layer thickness in the drawings does not represent the proportional relationship of the actual layer thickness. And in the case of no conflict, the embodiments of the present disclosure and the features in the embodiments may be combined with each other. The drawings of the embodiments in present application may use the same reference numerals, and the similarities between the embodiments may not be repeated.

Figure 2:
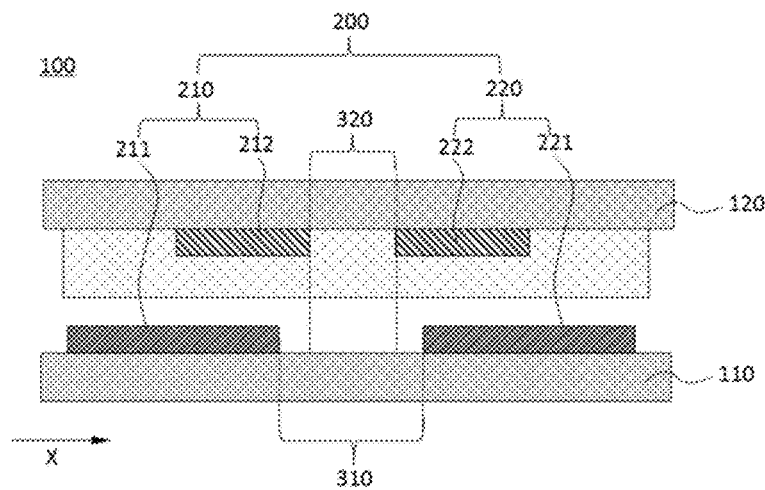
FIG. 2 illustrates a cross-sectional schematic along an A-A line in FIG. 1.

Referring to FIGS. 1-2, FIG. 1 illustrates a top view of a panel structure according to various embodiments of the present disclosure; and FIG. 2 illustrates a cross-sectional schematic along an A-A line in FIG. 1. To facilitate understanding, a portion of the structures in certain drawings of the present application may be shown in perspective.

A panel structure 100 may include a first substrate 110 and a second substrate 120, oppositely disposed.

Optionally, the panel structure 100 in one embodiment may be composed of certain film layers in a display panel. The display panel may be a liquid crystal display panel (LCD), an organic light-emitting diode panel (OLED), or a micro light-emitting diode (Micro-LED) display panel.

Optionally, the first substrate 110 and the second substrate 120 may respectively be two film layers need to be aligned and bonded or two parts need to be aligned in the above-mentioned display panel.

For example, when the panel structure 100 is used in a liquid crystal display panel, the liquid crystal display panel may include an array substrate, a color film substrate, and a liquid crystal layer sealed between the array substrate and the color film substrate by a frame adhesive. The first substrate 110 and the second substrate 120 may be the array substrate and the color film substrate, respectively. The array substrate and the color film substrate may refer to the structures of the array substrate and the color film substrate in the existing technology, which may not be described in detail herein.

When the panel structure 100 is used in the organic light-emitting display panel, the organic light-emitting display panel may include an array substrate, a light-emitting functional layer, an encapsulation layer which are sequentially stacked, thereby forming a basic display panel. The array substrate may include a substrate and an array layer on the side of the substrate facing the light-emitting functional layer. The array layer may include a plurality of thin-film transistors (TFTs). The thin-film transistors may be formed into pixel circuits used for the light-emitting elements in the display layer. The encapsulation layer may be an encapsulation cover plate which is attached to the array substrate through an adhesive material, thereby sealing the light-emitting functional layer. The first substrate 110 and the second substrate 120 may be the array substrate and the encapsulation layer, respectively.

Obviously, in some optional embodiments, the encapsulation layer may be a thin-film encapsulation layer. The encapsulation layer may include any quantity of stacked organic and inorganic materials. However, the encapsulation layer may at least include one organic material layer and at least one inorganic material layer which are deposited alternately, and the lowermost layer and the uppermost layer may be composed of inorganic materials. For example, the encapsulation layer may include a first inorganic encapsulation layer, a first organic encapsulation layer, and a second inorganic encapsulation layer, which are sequentially arranged along the direction of the light-emitting functional layer.

Obviously, in other optional embodiments of the present disclosure, the organic light-emitting display panel may further include a first functional layer on the side of the encapsulation layer away from the light-emitting functional layer. Optionally, the first functional layer may be a combination of one or more of a polarizer, a touch panel, a color film substrate, a blocking layer, a protection layer, and a cover plate. The first substrate 110 and the second substrate 120 may be the above-mentioned basic display panel and the first functional layer, respectively.

When the panel structure 100 is a structure in the micro light-emitting diode display panel, the micro light-emitting diode display panel may include an array substrate and one or more micro light-emitting diodes on the array substrate. The first substrate 110 and the second substrate 120 may respectively be the array substrate and the micro light-emitting diodes, which may be described in detail hereinafter.

The panel structure 100 may further include a capacitor group 200 including a first capacitor 210 and a second capacitor 220. The first capacitor 210 and the second capacitor 220 may not be overlapped with each other.

Optionally, the panel structure may be a display panel including a display region and a non-display region surrounding the display region. Optionally, the first substrate and the second substrate may be two film layers in the display panel, respectively; and the first capacitor and the second capacitor may be at the non-display region, such that the display region may not be occupied by the first capacitor and the second capacitor. For example, after the subsequent alignment detection is completed, whether the non-display region, where the capacitor group is located, is removed by cutting may be selected according to needs, thereby achieving the narrow-frame design requirement. Furthermore, the first capacitor and the second capacitor are respectively located in the non-display region on two opposite sides of the display region along a first direction, such that one side of the non-display region may be prevented from being excessively large, and two sides of the panel structure may be detected.

Furthermore, the first capacitor 210 may include a first A electrode 211 and a first B electrode 212 which are oppositely disposed.

The second capacitor 220 may include a second A electrode 221 and a second B electrode 222 which are oppositely disposed.

For example, the first A electrode 211 and the second A electrode 221 may be on the first substrate 110; and the first B electrode 212 and the second B electrode 222 may be on the second substrate 120.

It should be noted that the "the electrode on the substrate" mentioned herein indicates that the electrode may be formed using the substrate as a base substrate, and the electrode may be carried on the substrate before the first substrate and the second substrate are attached.

Optionally, other conductive film layers on the first substrate 110 may be multiplexed as the first A electrode 211 and the second A electrode 221; and other conductive film layers on the second substrate 120 may be multiplexed as the first B electrode 212 and the second B electrode 222. For example, when the first substrate 110 is an array substrate, the array substrate may include circuit elements such as thin-film transistors, capacitors, leads, and the like; the materials of the film layers where the gate electrodes, the source/drain electrodes of the thin-film transistors, the capacitors and leads are located may be multiplexed as the first A electrode 211 and the second A electrode 221, which may be fabricated in a same process to save cost and improve efficiency.

Optionally, the first B electrode 212 and the second B electrode 222 may be on the side of the second substrate 120 facing the first substrate 110; and a protection layer may also be disposed at the first B electrode 212 and the second B electrode 222 on the side of the second substrate 120 facing the first substrate 110. In such way, the electrodes of the capacitor may be prevented from being scratched to affect the detection result during the alignment adjustment. Optionally, the principle of the first A electrode 211 and the second A electrode 221 may be similar to that of the first B electrode 212 and the second B electrode 222, which may not be described in detail herein.

Furthermore, the first B electrode 212 may be misaligned with the first A electrode 211 along the first direction X; and the second B electrode 222 may be misaligned with the second A electrode 221 along the opposite direction of the first direction X.

For example, the A type electrode and the B type electrode in a same above-mentioned capacitor may be staggered with each other; and the above-mentioned misalignment may refer to that two opposite ends of the A type electrode and the B type electrode in the same capacitor may not overlap along a direction in parallel with the first direction X.

That is, the end of the first B electrode 212 facing toward the first direction X may not overlap the first A electrode 211; and the end of the first A electrode 211 facing away from the first direction X may not overlap the first B electrode 212. On the contrary, the end of the second B electrode 222 facing away from the first direction X may not overlap the second A electrode 221; and the end of the second A electrode 221 facing toward the first direction X may not overlap the second B electrode 222.

In other words, along the direction in parallel with the first direction X: the first A electrode 211 and the first B electrode 212 at two opposite ends of the first capacitor 210 may both be staggered; and the second A electrode 221 and the second B electrode 222 at two opposite ends of the second capacitor 220 may both be staggered. However, the first A electrode 211 and the first B electrode 212 may at least partially overlap, and the second A electrode 221 and the second B electrode 222 may at least partially overlap.

Taking the drawings of one embodiment as an example, along the direction in parallel with the first direction X: two adjacent ends of the first B electrode 212 and the second B electrode 222 may both not overlap the first A electrode 211 and the second A electrode 221; and two opposite ends of the first A electrode 211 and the second A electrode 221 may both not overlap the first B electrode 212 and the second B electrode 222.

It should be understood that, unless otherwise specified, the "overlap" of two film layers or two structures mentioned in the embodiments of the present application may refer to the overlapping of the orthographic projections of the two film layers or two structures on the plane where the panel structure is located. It can also be understood that the orthographic projection of one structure or film layer of the two structures or film layers on the plane where the other structure or film layer is located may overlap the other structure or film layer.

Optionally, the capacitor group 200 may be multiplexed as an alignment mark when the first substrate 110 is aligned with the second substrate 120, and the alignment status may be fed back through the capacitance difference between the first capacitor 210 and the second capacitor 220. For example, when the alignment of the second substrate 120 relative to the first substrate 110 is deviated along the opposite direction of the first direction (e.g., relative to the reference, the second substrate 120 may not move and the first substrate 110 may move along the first direction X), the straight-facing area of the first A electrode 211 and the first B electrode 212 in the first capacitor 210 may increase, the detected capacitance value of the first capacitor 210 may increase relative to the capacitance value of the first capacitor 210 without alignment deviation. Similarly, the capacitance value of the second capacitor 220 may decrease relative to the capacitance value of the second capacitor 220 without alignment deviation. Therefore, by detecting the capacitance values of the first capacitor and the second capacitor, it may determine the result of "the alignment deviation of the first substrate relative to the second substrate along the opposite direction of the first direction". Furthermore, the changing trends of the first capacitor 210 and the second capacitor 220 are opposite, such that the magnitude of the alignment deviation may be determined according to the difference between the capacitance value of the first capacitor 210 and the capacitance value of the second capacitor 220.

Optionally, the panel structure may further include leads connected to the type-A electrodes and the type-B electrodes in all of the first capacitors and the second capacitors. The leads may electrically connect the type-A electrodes and the type-B electrodes in all of the first capacitors and the second capacitors with a processing module. Optionally, the processing module may a control unit, a detection unit, a chip, and the like, and may transmit a detection signal to the capacitor group, receive or detect the capacitance magnitude of the capacitor in the capacitor group, and process the detected data. The processing module may be disposed on the panel structure and also on an external device which does not belong to the panel structure.

Although the capacitor group 200 including the first capacitor 210 and the second capacitor 220 is taken as example for illustration in one embodiment, it can be understood that the present application may not limit the quantity of the first capacitors 210 and the second capacitors 220 included in the capacitor group 200. The capacitor group 200 may include a plurality of first capacitors 210 and second capacitors 220.

In one embodiment, on the one hand, the alignment error may be determined by capacitance detection, which is more accurate than camera photographing, thereby improving the detection accuracy; on the other hand, through the combination of the first capacitor and the second capacitor, it may not only detect the alignment deviation, but also detect the direction of the alignment deviation. Furthermore, the position deviation between the first substrate and the second substrate may reflect the direction of the alignment deviation through the capacitance; moreover, due to the special positional relationship between the first A electrode, the second A electrode, the first B electrode and the second B electrode in the first capacitor and the second capacitor, the changing trends of the capacitance value of the first capacitor and the capacitance value of the second capacitor may be exactly opposite when the alignment deviation occurs along the first direction. In the present application, the difference between the capacitance value of the first capacitor and the capacitance value of the second capacitor may be used to determine whether the alignment deviation occurs, which is equivalent to that the detection result is the superposition of the capacitance change value of the first capacitor and the capacitance change value of the second capacitor. That is, the capacitance group may amplify the detection result and even small deviation may be clearly reflected by the detection result, thereby improving the detection sensitivity and accuracy. In the present application, it may not only improve the detection sensitivity and accuracy of the alignment deviation, but also obtain the direction of the alignment deviation, which may provide the reference to subsequent alignment adjustment to improve the alignment efficiency.

Referring to FIGS. 1-2, optionally, the first capacitor 210 and the second capacitor 22 may be arranged along the direction in parallel with the first direction X.

It should be noted that the arrangement direction of the first capacitor 210 and the second capacitor 220 may be one direction of the directions in parallel with the plane where the panel structure 100 is located. To facilitate the description hereinafter, the arrangement direction of the first capacitor 210 and the second capacitor 220 in the capacitor group 200 is defined as the first direction X.

Optionally, the spacing between the first A electrode 211 and the second A electrode 221 is a first spacing 310; and the spacing between the first B electrode 212 and the second B electrode 222 is a second spacing 320.

The orthographic projection of the second spacing 320 on the plane where the panel structure 100 is located may be within the orthographic projection of the first spacing 310 on the plane where the panel structure 100 is located. That is, the first B electrode 212 may cover the edge of the first A electrode 211 adjacent to the second capacitor 220, and the second B electrode 222 may cover the edge of the second A electrode 221 facing the first capacitor 210.

Furthermore, when the first capacitor 210 is disposed symmetrically relative to the second capacitor 220, the capacitance value of the first capacitor 210 may be equal to the capacitance value of the second capacitor 220.

For example, the first A electrode 211 and the second A electrode 221 may be arranged along the direction in parallel with the first direction X and may be symmetrical with respect to the first spacing 310. That is, the central axis of the first spacing 310 perpendicular to the first direction X may correspond to a first symmetry axis Z1, and the first A electrode 211 and the second A electrode 221 may be symmetrical with respect to the first symmetry axis Z1.

Similarly, the first B electrode 212 and the second B electrode 222 may be arranged along the direction in parallel with the first direction X and may be symmetrical with respect to the second spacing 320. That is, the central axis of the second spacing 320 perpendicular to the first direction X may correspond to a second symmetry axis Z2, and the first B electrode 212 and the second B electrode 222 may be symmetrical with respect to the second symmetry axis Z2.

When the first capacitor 210 and the second capacitor 220 are disposed symmetrically, the central axes of the first spacing 310 and the second spacing 320 may be coincided with each other or the first symmetry axis Z1 may coincide with the second symmetry axis Z2.

Optionally, in one embodiment, after the first substrate and the second substrate are correctly aligned, the capacitance value of the first capacitor may be equal to the capacitance value of the second capacitor, theoretically.

Obviously, when considering other influences and the allowable error range, after the first substrate and the second substrate are correctly aligned (e.g., the first capacitor 210 and the second capacitor 220 are disposed symmetrically in one embodiment), the capacitance value of the first capacitor and the capacitance value of the second capacitor may not be greater than a first threshold mentioned below, which may refer to the detailed description in the present application.

The capacitance value of the first capacitor and the capacitance value of the second capacitor may have a same initial change magnitude according to one embodiment. That is, when the alignment deviation occurs, the capacitance value of the first capacitor and the capacitance value of the second capacitor may be changed based on a same capacitance value (e.g., the capacitance value when the capacitance value of the first capacitor and the capacitance value of the second capacitor are equal to each other). Therefore, the numerical range of possible detection results may not be excessively large, which is beneficial for the calculation of the processor.

Figure 3:
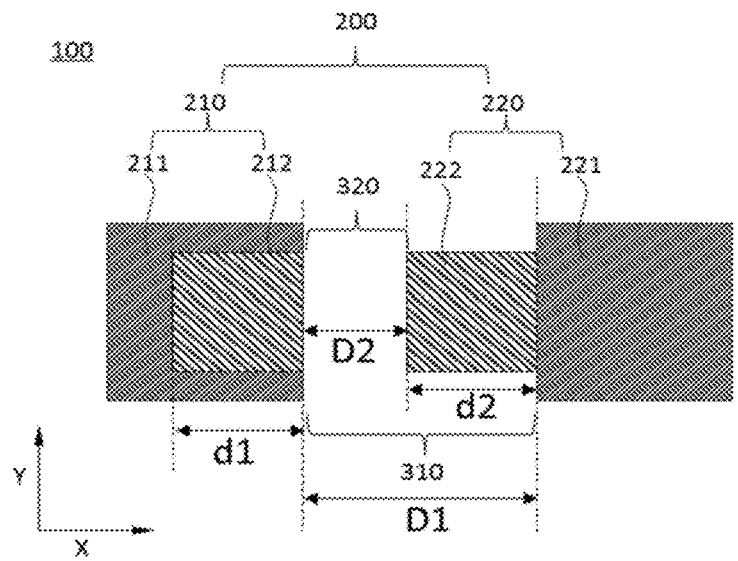
FIG. 3 illustrates a schematic of an alignment situation in FIG. 1.

Referring to FIGS. 1-3, FIG. 3 illustrates a schematic of an alignment situation in FIG. 1, and the similarities with the above-mentioned embodiment may not be described in detail.

It may be different that, along the direction in parallel with the first direction X: the spacing distance between the first A electrode 211 and the second A electrode 221 is D1, and the spacing distance between the first B electrode 212 and the second B electrode 222 is D2.

That is, the width of the first spacing 310 (e.g., the size of the first spacing 310 along the first direction X) is D1; and the width of the second spacing 320 (e.g., the size of the second spacing 320 along the first direction X) is D2, where D1>D2, that is, the width of the first spacing 310 is greater than the width of the second spacing 320.

Furthermore, the length of the first B electrode 212 is d1, and the length of the second B electrode 222 is d2, where D1>d1 and D1>d2.

According to one embodiment, it may be avoided that when a large alignment deviation occurs, the electrode in the first capacitor and the electrode in the second capacitor may overlap, which may result in that the detection result of a capacitor group is an obtained error after the crosstalk of two capacitors. In addition, misleading reverse results may be avoided according to one embodiment.

It should be noted that, for the case where the capacitor group includes a plurality of first capacitors and second capacitors, the first capacitor and the second capacitor mentioned in one embodiment may be two adjacent capacitors in the capacitor group (referring to no other first capacitor or second capacitor spacing in the capacitor group).

Furthermore, along the direction in parallel with the first direction X: the length of the first B electrode may be equal to the length of the second B electrode which are both d; that is, d1=d2=d, where d+D2=D1.

According to one embodiment, the width D1 of the first spacing may be set to meet the above-mentioned requirement of d+D2=D1, which may effectively utilize the capacitor group with a limited area while still ensuring accuracy and sensitivity. The effective detection distance of the capacitor group may actually be the length of the overlapping region of the first B electrode and the first A electrode (or the second B electrode and the second A electrode) along the first direction when being correctly aligned. That is, if the alignment deviation along the first direction does not exceed the length of the overlapping region of the first B electrode and the first A electrode (or the second B electrode and the second A electrode), the detected results may be composed of the superposition of the capacitance changes of the first capacitor 210 and the second capacitor 220 (which is equivalent to amplifying the detection results), such that the accuracy and sensitivity of the detection results may be more stable.

Optionally, along the first direction X: the length of the first B electrode 212 is d1, and the length of the second B electrode 222 is d2, where the range of d1 and d2 may be about 5 microns to about 2000 microns, and furthermore, the range of d1 and d2 may be about 10 microns to about 1000 microns.

Optionally, the first capacitor and the second capacitor may be arranged in the non-display region. Obviously, in other optional embodiments of the present application, the capacitor group may be arranged in the display region as required.

Optionally, when the capacitor group is arranged in the display region, for example, in one embodiment where the first substrate is an array substrate and the second substrate includes micro light-emitting diodes, the range of d1 and d2 may be about 5 micrometers to about 200 micrometers; furthermore, the range of d1 and d2 may be about 10 micrometers to about 100 micrometers.

It is difficult to detect the alignment deviation between about 5 micrometers and about 10 micrometers, so that the capacitor group may be set according to the above-mentioned parameter requirements. Meanwhile, optionally, along the first direction, the length of the straight-facing region of the two electrodes of the first capacitor may be about 10 micrometers to about 100 micrometers, and the length of the straight-facing region of the two electrodes of the second capacitor may be about 10 micrometers to about 100 micrometers. In such way, the range of the capacitor group may meet the detection requirements, and the area of the panel structure occupied by the capacitor group may be reduced.

Referring to the any one of the above-mentioned embodiments and drawings, optionally, along a second direction Y: the length of the first A electrode 211 and the length of the first B electrode 212 may be different; and/or, the length of the second A electrode 221 and the length of the second B electrode 222 may be different, where the second direction Y intersects the first direction X.

A certain distance may be maintained between the edges of the type A electrode and type B electrode which are oppositely arranged along the second direction according to one embodiment, which may avoid that the alignment deviation of the first substrate and the second substrate along the second direction affects the detection results of the capacitor group for detecting the deviation along the direction in parallel with the first direction. In other words, the projection of the type A electrode may fall into the projection of the type B electrode along the second direction, and the type A electrode may need to move a certain distance to exceed the projection range of the type B electrode along the second direction. As long as the movements of the type A electrode along the second direction do not exceed the projection range of the type B electrode along the second direction, the movements may not be reflected in the changes of the capacitance values of the corresponding capacitor. Or, the projection of the type B electrode may fall into the projection of the type A electrode along the second direction, and the type B electrode may need to move a certain distance to exceed the projection range of the type A electrode along the second direction. As long as the movements of the type B electrode along the second direction do not exceed the projection range of the type A electrode along the second direction, the movements may not be reflected in the changes of the capacitance values of the corresponding capacitor. Therefore, the alignment deviation along the second direction may be avoided to affect the detection results according to one embodiment.

For example, in some alternative embodiments, the length of the first A electrode 211 may be greater than the length of the first B electrode 212; and/or, the length of the second A electrode 221 may be greater than the length of the second B electrode 222.

Figure 4:
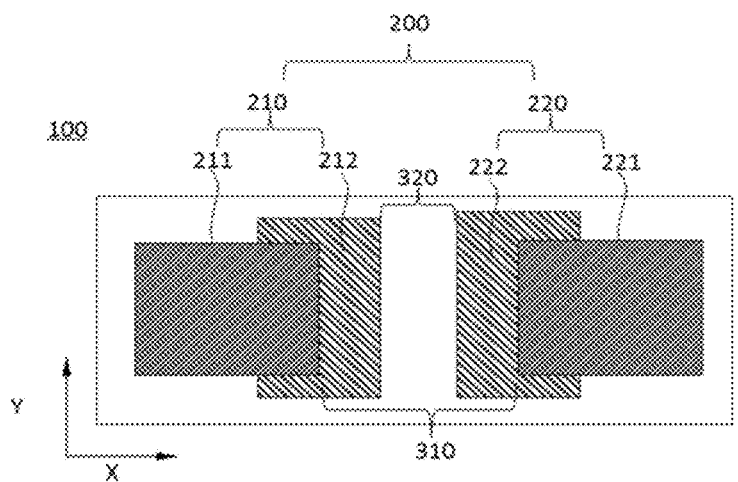
FIG. 4 illustrates a top view of another panel structure according to various embodiments of the present disclosure.

Obviously, in an optional embodiment, referring to FIG. 4, FIG. 4 illustrates a top view of another panel structure according to various embodiments of the present disclosure.

Along the second direction Y, the length of the first A electrode 211 may be less than the length of the first B electrode 212; and/or, the length of the second A electrode 221 may be less than the length of the second B electrode 222.

Optionally, the first direction X is perpendicular to the second direction Y, and both are in parallel with the plane where the panel structure 100 is located.

That is, although the length of the type B electrode is smaller than the length of the type A electrode along the first direction, the dimension of the type B electrode may be larger than the dimension of the type A electrode along the direction perpendicular to the first direction. In such way, the area of the type B electrode may not differ greatly from the area of the type A electrode.

According to one embodiment, while avoiding the influence of the alignment deviation along the second direction on the detection results, it may ensure that the fabrication area of each electrode may not be excessively small to improve the precision of the formed electrode, thereby improving the detection accuracy.

Figure 5:
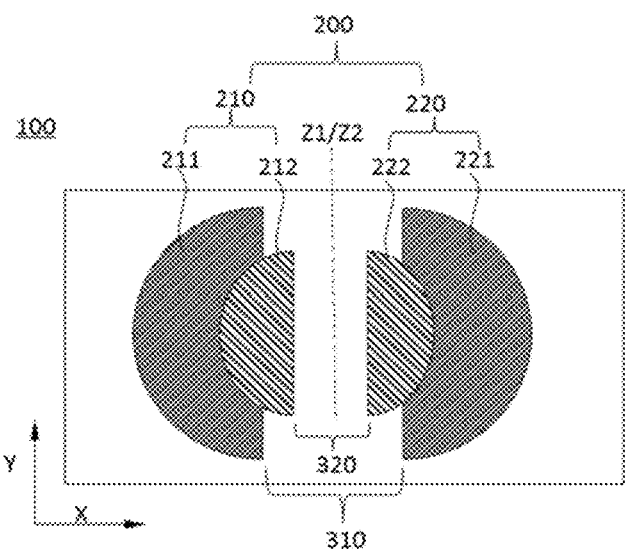
FIG. 5 illustrates a top view of another panel structure according to various embodiments of the present disclosure.

Obviously, in some optional embodiments, referring to FIG. 5, FIG. 5 illustrates a top view of another panel structure according to various embodiments of the present disclosure. Different from the above-mentioned embodiments, the capacitors in the capacitor group 200 may be circular or semi-circular.

Optionally, the first A electrode 211 and the first B electrode 212 in the first capacitor 210 may both be semi-circular. Optionally, the first A electrode 211 may be similar to the first B electrode 212, but the semicircular diameter of the first A electrode 211 may be larger than the semicircular diameter of the first B electrode 212.

In addition, the straight side of the semicircular first A electrode 211 and the straight side of the semicircular first B electrode 212 may both face the second capacitor 220.

And/or, the second A electrode 221 and the second B electrode 222 in the second capacitor 220 may both be semicircular. Optionally, the second A electrode 221 may be similar to the second B electrode 222, but the semicircular diameter of the second A electrode 221 may be larger than the semicircular diameter of the second B electrode 222. In addition, the straight side of the semicircular second A electrode 221 and the straight side of the semicircular second B electrode 222 may both face the first capacitor 210.

That is, if the first capacitor 210 and the second capacitor 220 are both semi-circular, the straight sides of two semicircular capacitors may be arranged to be opposite to each other. The first capacitor 210 and the second capacitor 220 may be assembled into a complete circle.

There is a need to exclude the influence of the alignment deviation along the direction, which is not in parallel with the first direction X, on the detection result, so that, along the direction not in parallel with the first direction X, the size of the type A electrode may be different from the size of the type B electrode. A certain space may be reserved for the misalignment of the type A and B electrodes along any other direction which is not in parallel with the first direction X according to one embodiment, such that even if a certain misalignment occurs along the direction not in parallel with the first direction X, the misalignment may not affect the detection result. In addition, the reserved spaces in other directions which are not in parallel with the first direction X may be uniform, such that the stability of the detection accuracy may be more desirable. Furthermore, the semicircular and circular designs may reduce the space occupied by the capacitor group in the panel structure. That is, the accuracy of the detection results may further be improved, and the panel space may also be saved according to one embodiment.

Figure 6:
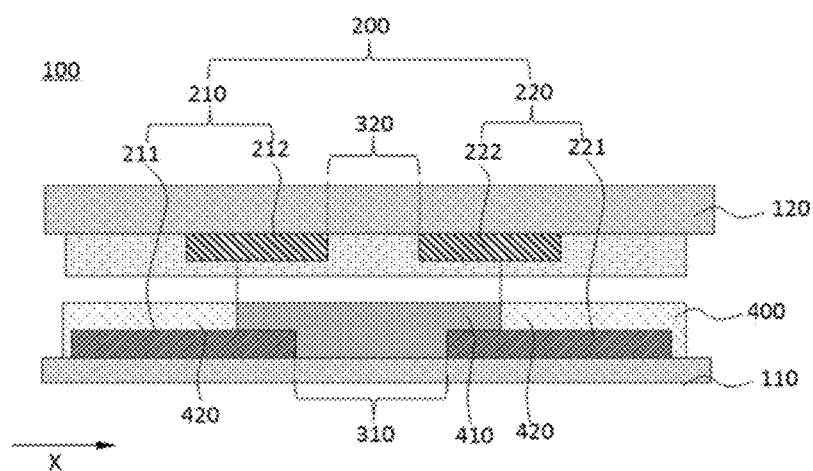
FIG. 6 illustrates another cross-sectional schematic along an A-A line in FIG. 1.

Referring to FIG. 6, FIG. 6 illustrates another cross-sectional schematic along the A-A line in FIG. 1.

The panel structure 100 may further include a dielectric layer 400. For example, the dielectric layer 400 may be at least between the first A electrode 211 and the first B electrode 212 and between the second A electrode 221 and the second B electrode 222.

Optionally, the dielectric layer 400 may be an organic insulation layer or an inorganic insulation layer.

Optionally, the dielectric layer 400 may be a flat entire-surface structure and spaced between the first substrate 110 and the second substrate 120. That is, after forming the type A electrode and the type B electrode on the first substrate 110 and the second substrate 120 respectively and before aligning and bonding the first substrate 110 with the second substrate 120, the dielectric layer 400 may first be formed on the side of the first substrate 110 facing the second substrate 120 or the side of the second substrate 120 facing the first substrate 110.

Optionally, the dielectric layer 400 may include a first region 410 and a second region 420 located on both sides of the first region 410 along the direction in parallel with the first direction X.

The dielectric constant of the first region 410 is $\varepsilon1$, the dielectric constant of the second region 420 is $\varepsilon2$, and $\varepsilon1<\varepsilon2$. The dielectric constant of the first region 410 is smaller than the dielectric constant of the second region 420.

Optionally, the spacing between the first A electrode 211 and the second A electrode 221 is the first spacing 310; the spacing between the first B electrode 212 and the second B electrode 222 is the second spacing 320. The spacing distance between the first A electrode 211 and the second A electrode 221 is D1, and the spacing distance between the first B electrode 212 and the second B electrode 222 is D2. That is, the width of the first spacing 310 (e.g., the magnitude of the first spacing 310 along the first direction X) is D1; the width of the second spacing 320 (e.g., the magnitude of the second spacing 320 in the first direction X) is D2, where D1>D2, that is, the width of the first spacing 310 is greater than the width of the second spacing 320.

The orthographic projection of the second spacing 320 on the plane where the panel structure 100 is located may be within the orthographic projection of the first spacing 310 on the plane where the panel structure 100 is located.

The alignment deviation of the first substrate 110 and the second substrate 120 may cause the center lines of the first spacing 310 and the second spacing 320 to be not overlapped, or cause the positional relationship between the first spacing 310 and the second spacing 320 to not meet that the first capacitor 210 is equal to the second capacitor 220. However, when the second spacing 320 is displaced within the range of the first spacing 310 along the direction in parallel with the first direction X, the boundary position of the first region 410 and the second region 420 may meet the following requirements:

the boundary between the first region 410 and the second region 420 may fall within the overlapping region of the first A electrode 211 and the first B electrode 212, and may be displaced relative to one of the first A electrode 211 and the first B electrode 212 (in one embodiment, relative to the first B electrode 212). That is, at least a portion of the first region 410 overlaps the straight-facing region of the first A electrode 211 and the first B electrode 212 along the direction perpendicular to the plane where the panel structure 100 is located, and at least a portion of the second region 420 overlaps the straight-facing region of the first A electrode 211 and the first B electrode 212 along the direction perpendicular to the plane where the panel structure 100 is located. In addition, as the second spacing 320 is displaced relative to the first spacing 310 along the direction in parallel with the first direction X, the area of the straight-facing region of the first A electrode 211 and the first B electrode 212 along the direction perpendicular to the plane of the panel structure 100 may be changed; meanwhile, the boundary between the first region 410 and the second region 420 may also be displaced relative to the first A electrode 211 or relative to the first B electrode 212.

And/or, the boundary between the first region 410 and the second region 420 may fall within the overlapping region of the second A electrode 221 and the second B electrode 222 and may be displaced relative to one of the second A electrode 221 and the second B electrode 222. That is, at least a portion of the first region 410 overlaps the straight-facing region of the second A electrode 221 and the second B electrode 222 along the direction perpendicular to the plane where the panel structure 100 is located, and at least a portion of the second region 420 overlaps the straight-facing region of the second A electrode 221 and the second B electrode 222 along the direction perpendicular to the plane where the panel structure 100 is located. In addition, as the second spacing 320 is displaced relative to the first spacing 310 along the direction in parallel with the first direction X, the area of the straight-facing region of the second A electrode 221 and the second B electrode 222 along the direction perpendicular to the plane of the panel structure 100 may be changed; meanwhile, the boundary between the first region 410 and the second region 420 may also be displaced relative to the second A electrode 221 or relative to the second B electrode 222.

Taking the first capacitor as an example, after the alignment is deviated, the change in the capacitance value of the first capacitor may not only be caused by the change in the straight-facing area of the first A electrode and the first B electrode, and but also be caused by the change of the dielectric constant of the dielectric layer between the straight-facing regions of the first A electrode and the first B electrode according to one embodiment. According to one embodiment, the dielectric layer may be particularly designed to be partitioned according to the capacitor structure and arrangement characteristics in the present disclosure, such that the dielectric constant of the first region may be smaller than the dielectric constant of the second region. Since the capacitance value of the capacitor is proportional to the dielectric constant and the straight-facing area of the capacitor electrode, it may ensure that, for the displacement deviation along a same direction, the changing trend of the capacitance value caused by the change of the straight-facing area of the first A electrode and the first B electrode is consistent with the changing trend of the capacitance value caused by the change of the dielectric constant. The principle of the second capacitor may be same as the principle of the first capacitor, which may not be described in detail herein. Therefore, it is equivalent that the capacitance change may be amplified through the dielectric layer, thereby enabling the detection result easier to be detected, which may further improve the detection sensitivity and accuracy according to one embodiment.

Figure 7:
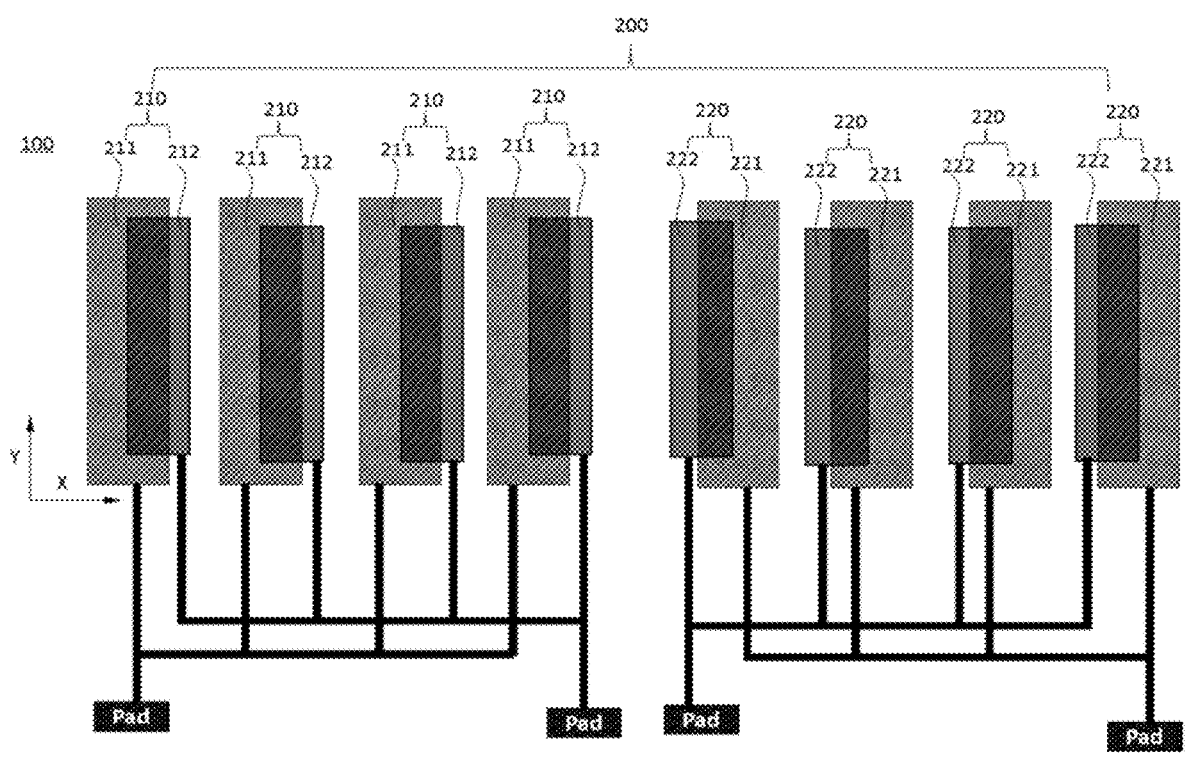
FIG. 7 illustrates a top view of another panel structure according to various embodiments of the present disclosure.

Referring to FIG. 7, FIG. 7 illustrates a top view of another panel structure according to various embodiments of the present disclosure. The similarities with the above-mentioned embodiments may not be described in detail herein.

It may be different that, one capacitor group 200 may include a plurality of first capacitors 210. The first A electrodes 211 of the first capacitors 210 in a same capacitor group 200 may all be electrically connected to each other. For example, the first A electrodes 211 may be electrically connected to each other by leads, and then be connected to a control unit. The first B electrodes 212 of the first capacitors 210 in a same capacitor group 200 may all be electrically connected to each other. For example, the first B electrodes 212 may be electrically connected to each other by leads, and then be connected to a control unit.

And/or, one capacitor group 200 may include a plurality of second capacitors 220. The second A electrodes 221 of the second capacitors 220 in a same capacitor group 200 may all be electrically connected to each other. For example, the second A electrodes 221 may be electrically connected to each other by leads, and then be connected to a control unit. The second B electrodes 222 of the second capacitors 220 in a same capacitor group 200 may all be electrically connected to each other. For example, the second B electrodes 222 may be electrically connected to each other by leads, and then be connected to a control unit.

According to one embodiment, the alignment deviation detection may be enhanced, and the detection result may be amplified by a plurality of first capacitors connected to each other and a plurality of second capacitors connected to each other, which further improves the detection sensitivity and accuracy.

Optionally, the plurality of first capacitors 210 in one capacitor group 200 may be arranged along the first direction X; and/or the plurality of second capacitors 220 in one capacitor group 200 may be arranged along the first direction X.

Furthermore, the first capacitor 210 may be a strip capacitor with a width direction in parallel with the first direction X; and/or, the second capacitor 220 may be a strip capacitor with a width direction in parallel with the first direction X.

For example, the first A electrode 211 and the first B electrode 212 in the first capacitor 210 may both be elongated or rectangular, and the extension direction or the length direction may be a direction perpendicular to the first direction X. The second A electrode 221 and the second B electrode 222 in the second capacitor 220 may both be elongated or rectangular, and the extension direction or the length direction may be a direction perpendicular to the first direction X.

That is, taking the first capacitor 210 as an example, the first capacitor 210 may occupy a relatively small area along the first direction X, such that more first capacitors 210 may be arranged. Meanwhile, the length of the first capacitor 210 along the direction perpendicular to the first direction X may be relatively large, such that the relatively small deviation along the first direction X may result in the change of the straight-facing area between the first A electrode 211 and the first B electrode 212 with a larger area. Therefore, the change magnitude of the capacitance value of the first capacitor may be larger, and a significantly small alignment deviation may also be detected. According to one embodiment, the capacitor area may be fully utilized, and the capacitor with a same size area may detect displacement deviation more accurately and sensitively, thereby further improving the detection sensitivity and accuracy while sufficiently utilizing the panel structure space.

Referring to one embodiment shown in FIG. 7, optionally, the first capacitor 210 and the second capacitor 220 in the same capacitor group 200 may be arranged together along a same straight line in parallel with the first direction X.

Figure 8:
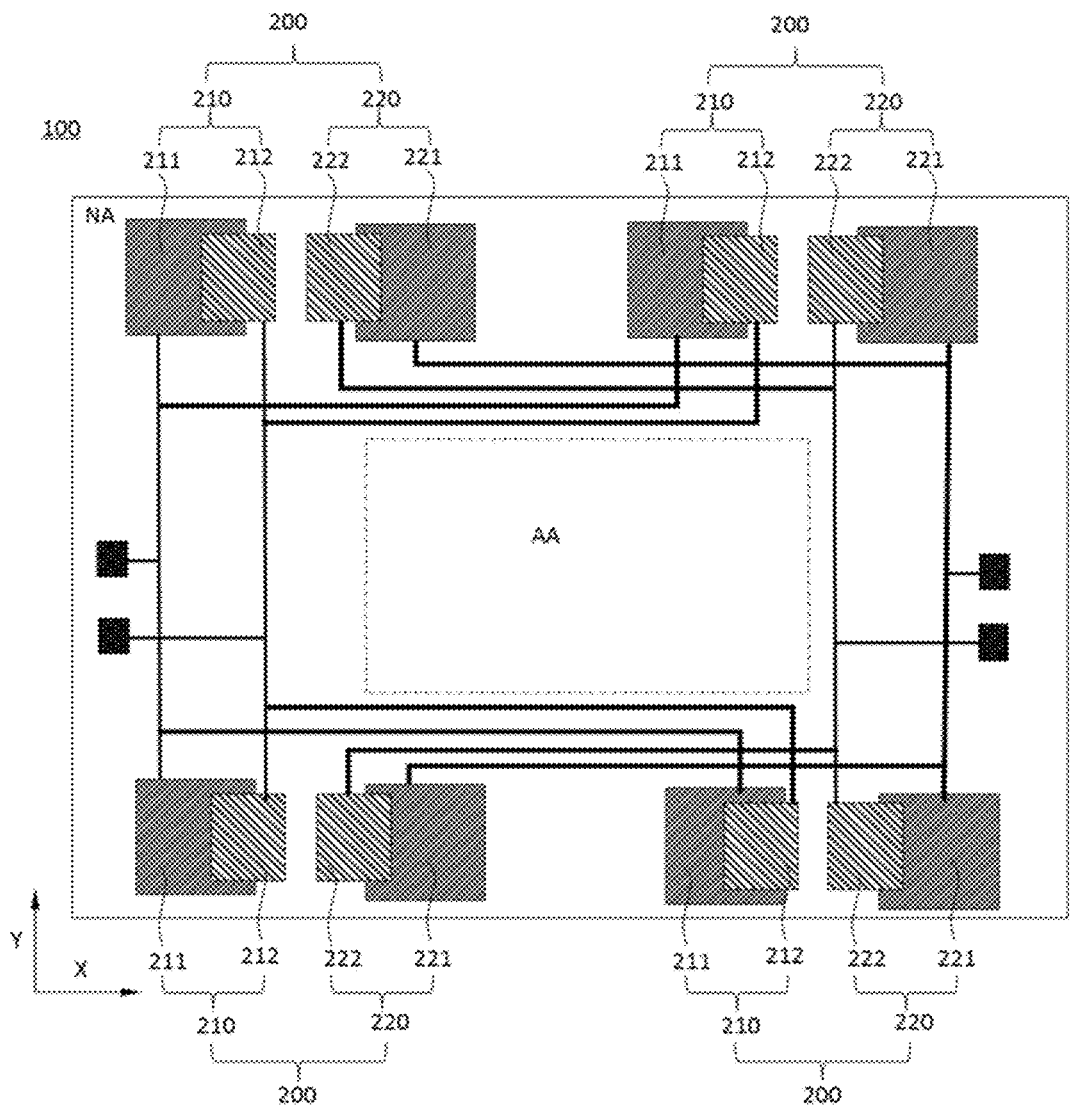
FIG. 8 illustrates a top view of another panel structure according to various embodiments of the present disclosure.

Obviously, in other optional embodiments of the present application, FIG. 8 illustrates a top view of another panel structure according to various embodiments of the present disclosure. The first capacitors 210 and the second capacitors 220 in the same capacitor group 200 can be paired where each pair has two capacitors, and all pairs may be set in different positions of the panel structure. The first capacitor 210 and the second capacitor 220 in each pair may be oppositely arranged along the same straight line in parallel with the first direction X; and the first capacitor 210 and the second capacitor 220 of different pairs may be located on different straight lines. The first capacitor 210 and the second capacitor 220 in the same pair may optionally meet the requirements for the first capacitor and the second capacitor in the above-mentioned embodiments. In such way, multiple positions of the panel structure may be detected to improve reliability of the detection result.

It should be noted that, in one embodiment shown in FIG. 7, the first capacitors in the same capacitor group may be continuously arranged along the first direction for illustration. Obviously, in other optional embodiments of the present application, the first capacitors and the second capacitors in the same capacitor group may be alternately arranged along the first direction, where two adjacent capacitors including the first capacitor and second capacitor may optionally satisfy the definition of the first capacitor and the second capacitor in the above-mentioned embodiments.

Figure 9:
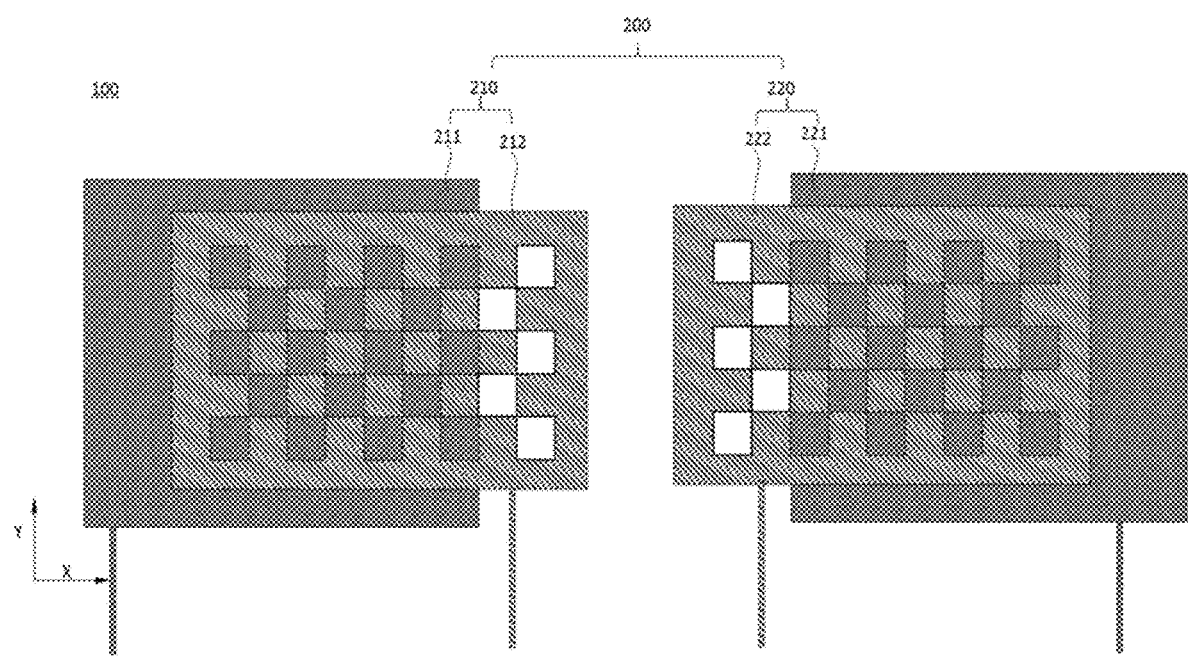
FIG. 9 illustrates a top view of another panel structure according to various embodiments of the present disclosure.

As shown in FIG. 9, FIG. 9 illustrates a top view of another panel structure according to various embodiments of the present disclosure. One of the first A electrode 211 and the first B electrode 212 may be a mesh (or grid) electrode, and/or, one of the second A electrode 221 and the second B electrode 222 may be a mesh (or grid) electrode.

For example, one of the first A electrode 211 and the first B electrode 212 may include a plurality of hollows passing through the electrode. Optionally, the plurality of hollows may be arranged in an array, and finally the electrode may be formed into a mesh structure where the mesh holes are the plurality of hollows. Similarly, one of the second A electrode 211 and the second B electrode 212 may include a plurality of hollows passing through the electrode. Optionally, the plurality of hollows may be arranged in an array, and finally the electrode may be formed into a mesh structure where the mesh holes are the plurality of hollows.

The first electrode B in the first capacitor is used as example for the mesh electrode in one embodiment. On the one hand, more induced electric fields may be generated around the electrode, and by changing the electrode pattern in one embodiment, the electrode may have more edges for the electrode of a same-sized area (referring to the area circled by the outmost contour of the electrode). In addition to the outermost contour edge of the electrode, the edges formed by the hollows in the electrode or the edges corresponding to the mesh holes may also be introduced which may generate more electric fields, and after the displacement causes the first A electrode and the first B electrode to be deviated, the change magnitude of the edges of the first B electrode covered by the first A electrode may be larger, such that, it is equivalent that the capacitance change magnitude caused by the deviation may be amplified, thereby further improving the detection sensitivity and accuracy. On the other hand, two electrodes in the same capacitor have different shapes, such that, before the alignment deviation of the capacitor group is detected, it may be easier to observe large alignment deviations which exceed the detection range of the capacitor group through a camera photographing or manual inspection.

Figure 10:
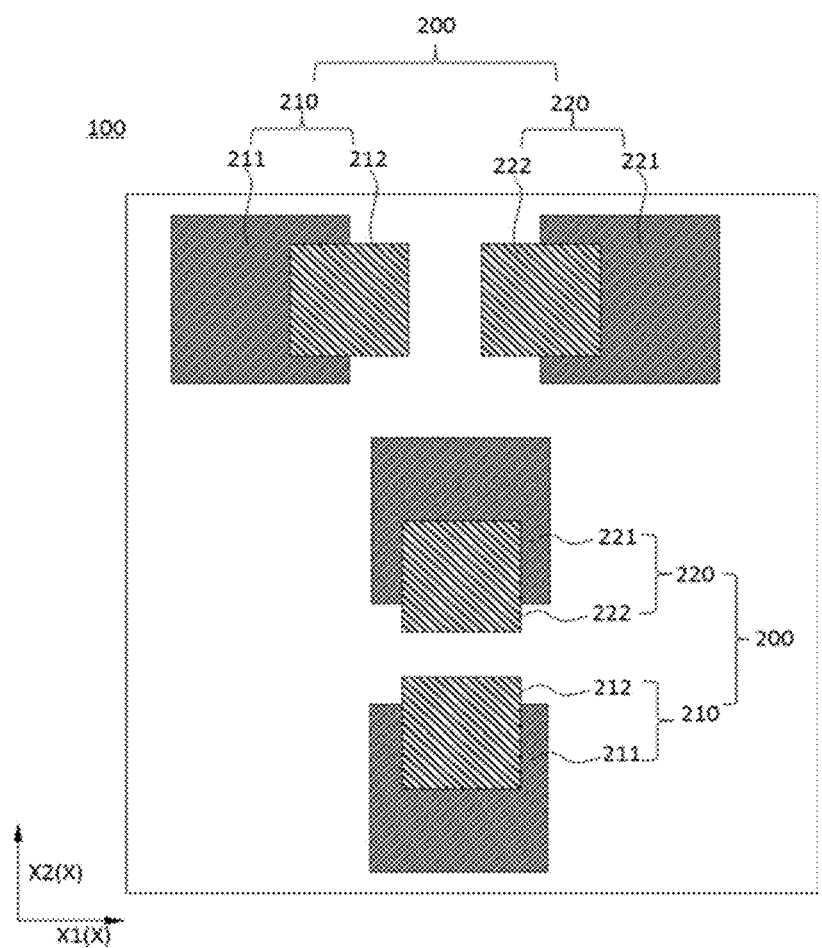
FIG. 10 illustrates a top view of another panel structure according to various embodiments of the present disclosure.

Referring to FIG. 10, FIG. 10 illustrates a top view of another panel structure according to various embodiments of the present disclosure. One panel structure 100 may include a plurality of capacitor groups 200, and the misalignment directions in at least two capacitor groups 200 may be different. Alignment deviations in multiple directions may be detected according to one embodiment to improve alignment efficiency.

For example, the first B electrode 212 in one of at least two capacitor groups 200 may be misaligned with the first A electrode 211 along the X1 direction, and the second B electrode 222 may be misaligned with the second A electrode 221 along the reverse direction of the X1 direction, where, for above-mentioned capacitor group 200, the first direction X is the X1 direction. The first B electrode 212 in another one of at least two capacitor groups 200 may be misaligned with the first A electrode 211 along the X2 direction, and the second B electrode 222 may be misaligned with the second A electrode 221 along the reverse direction of the X2 direction, where, for another above-mentioned capacitor group 200, the first direction X is the X2 direction. The X1 direction and the X2 direction are in parallel with the plane where the panel structure 100 is located, but the X1 direction and the X2 direction are not in parallel with each other, that is, the X1 direction and the X2 direction intersect in the plane in parallel with the panel structure. In such way, not only the alignment deviation in the X1 direction but also the alignment deviation in the X2 direction may be detected.

Optionally, the X1 direction is perpendicular to the X2 direction.

Figure 11:
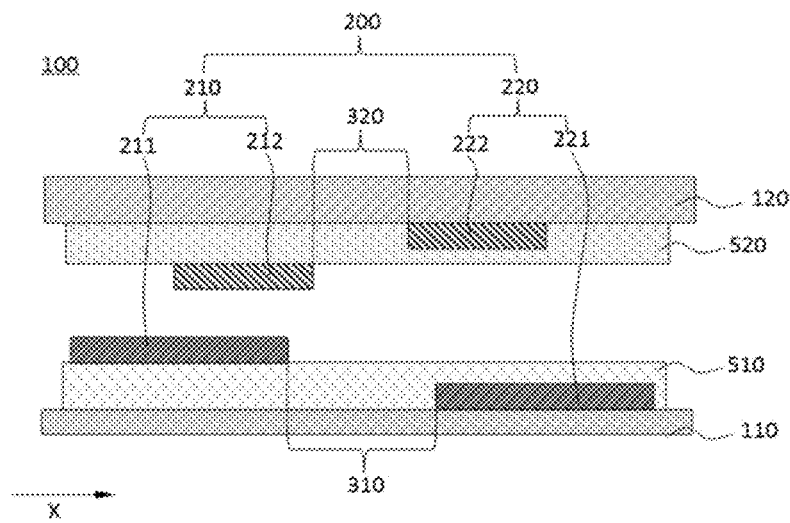
FIG. 11 illustrates another cross-sectional schematic along an A-A line in FIG. 1.

Referring to FIG. 11, FIG. 11 illustrates another cross-sectional schematic along the A-A line in FIG. 1. The first A electrode 211 and the second A electrode 221 may be located in different layers.

For example, the panel structure 100 may further include a first insulation layer 510 between the first A electrode 211 and the second A electrode 221. The second A electrode 221 may be between the first insulation layer 510 and the first substrate 110, and the first A electrode 211 may be on the side of the first insulation layer 510 away from the first substrate 110. The first A electrode 211 and the second A electrode may be on the side of the first substrate 110 facing the second substrate 120.

Optionally, the first B electrode 212 and the second B electrode 222 may be located on different film layers.

For example, the panel structure 100 may further include a second insulation layer 520 between the first B electrode 212 and the second B electrode 222. The second B electrode 222 may be between the first insulation layer 510 and the first substrate 110, and the first B electrode 212 may be on the side of the second insulation layer 520 away from the second substrate 120. The first B electrode 212 and the second B electrode 222 may be on the side of the second substrate 120 facing the first substrate 110.

Optionally, the first insulation layer 510 and the second insulation layer 520 may be flat film layers. The first insulation layer 510 and the second insulation layer 520 may be respectively multiplexed as a planarization layer or other organic insulating layer in the display panel.

According to one embodiment, the first A electrode 211 and the second A electrode 221 may be located on different film levels. The distance between the first A electrode 211 and the first B electrode 212 and the distance between the second A electrode 221 and the second B electrode 222 may be different.

According to one embodiment, the medium between the second A electrode 221 and the second B electrode 222 in the second capacitor 220 may have one more first insulation layer 510 and one more second insulation layer 520 than the medium between the first A electrode 211 and the second A electrode 221 in the first capacitor 210. The distance between the second A electrode 221 and the second B electrode 222 in the second capacitor 220 may be one more the first insulation layer 510 and one more the second insulation layer 520 thicker than the distance between the first A electrode 211 and the second A electrode 221 in the first capacitor 210, where the thickness is along the direction perpendicular to the plane of the panel structure 100.

Therefore, when the alignment deviation causes the electrodes in the first capacitor to be overlapped with the electrodes in the second capacitor, the vertical distances between the dielectric and the electrodes are different, such that the detected capacitance change result may have a significant large jump (or change) compared with the capacitance change caused by the straight-facing area change of the electrodes inside the capacitor due to the alignment deviation, and invalid detection results may be determined. Furthermore, the relatively large alignment deviations may be chosen to be corrected through camera photographing or manual inspection, without being misled by the detection results.

Obviously, in some other optional embodiments of the present application, the first B electrode 212 and the second B electrode 222 may be at a same film layer as required, that is, the first B electrode 212 and the second B electrode 222 may be at a same plane in parallel with the plane of the panel structure, which may not be described in detail herein.

Figure 12:
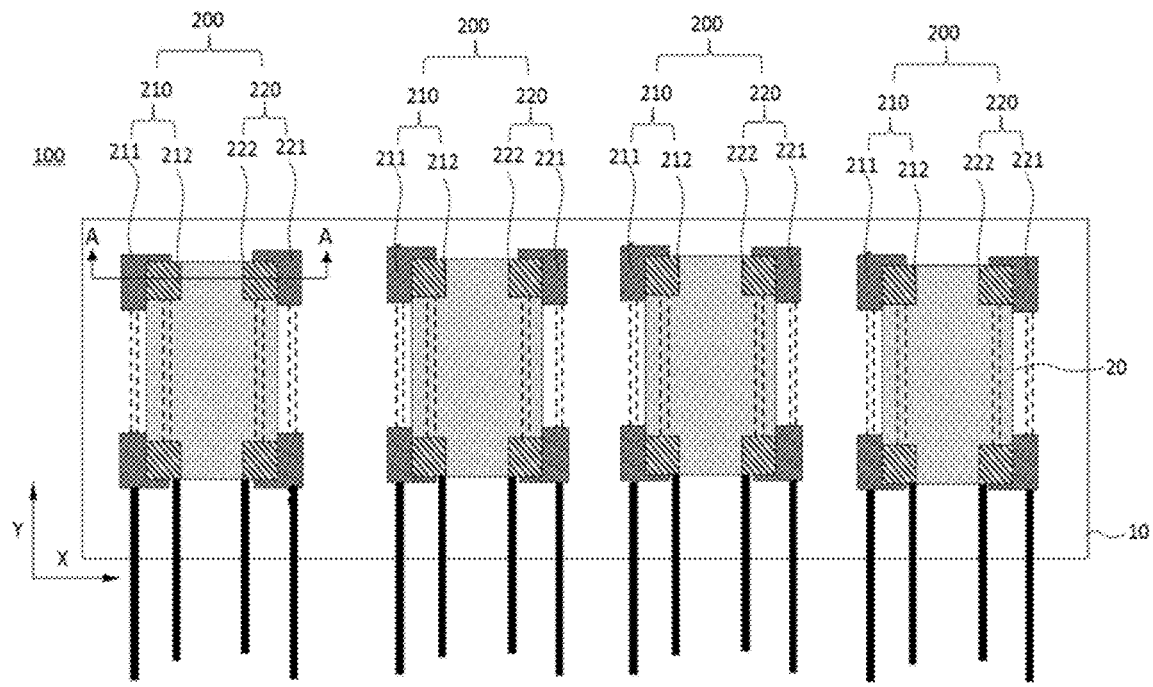
FIG. 12 illustrates a top view of another panel structure according to various embodiments of the present disclosure.
Figure 13:
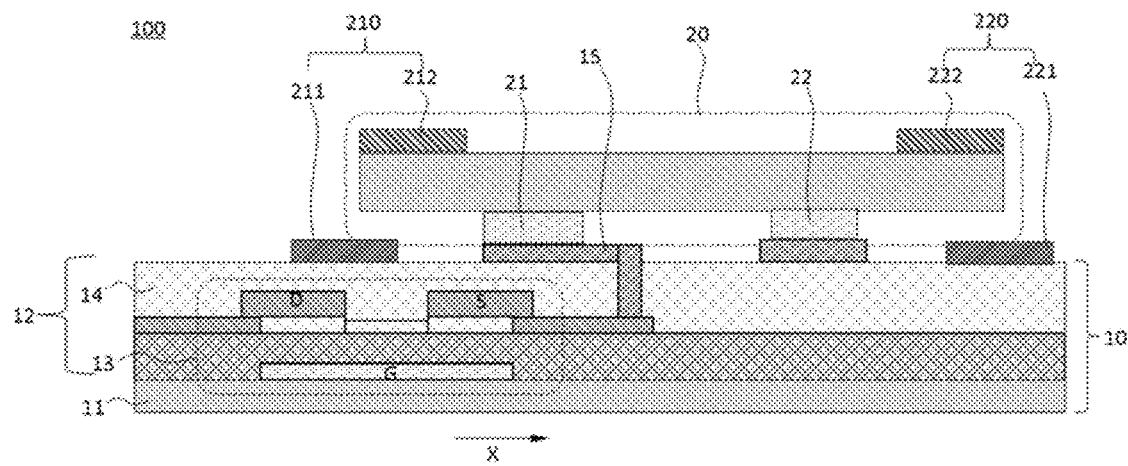
FIG. 13 illustrates a cross-sectional schematic along an A-A line in FIG. 12.

Referring to FIGS. 12-13, FIG. 12 illustrates a top view of another panel structure according to various embodiments of the present disclosure; and FIG. 13 illustrates a cross-sectional schematic along an A-A line in FIG. 12. In one embodiment, the panel structure 100 may be a micro light-emitting diode display panel, and the first substrate 110 and the second substrate 120 may be an array substrate 10 and micro light-emitting diodes 20, respectively.

For example, the array substrate 10 may include a substrate 11 and an array layer 12 disposed on the substrate. The array layer 12 may include a thin-film transistor 13 that constitutes a pixel circuit for driving the micro light-emitting diode 20 to emit light, and further include a planarization layer 14 covering the thin-film transistor 13. The array substrate 10 may further include a connection electrode 15 (e.g., a eutectic layer). The connection electrode 15 may be electrically connected to the thin-film transistor 13 through a via hole on the planarization layer 14. The electrodes of the light-emitting diode 20 may include an anode 21 and a cathode 22. After the light-emitting diode 20 is formed on the growth substrate, the light-emitting diode 20 needs to be aligned and connected to the array substrate after being transported, so that the light-emitting diode 20 may be aligned and connected to the corresponding connection electrode 15 through the anode 21 and the cathode 22, respectively.

Optionally, the first A electrode 211 and the second A electrode 221 may be located on the array substrate 10. Optionally, the first A electrode 211 and the second A electrode 221 may be located at a same layer and made of a same material as the connection electrode 15. Obviously, in other optional embodiments of the present application, the first A electrode 211 and the second A electrode 221 may be located at a same layer and made of a same material as another conductive layer in the array layer 12.

Optionally, the first B electrode 212 and the second B electrode 222 may be located on the micro light-emitting diode 20.

Optionally, the panel structure 100 may include a plurality of micro light-emitting diodes 20. Each micro light-emitting diode 20 may be correspondingly provided with one capacitor group 200 and may be connected to the testing machine on the outside of the substrate through leads. Through the data processing of the machine, the alignment of each micro light-emitting diode 20 may be acquired. Then the data may be fed back to the bonding machine of the micro light-emitting diodes 20, and the adjustment may be made for each micro light-emitting diode 20. The alignment accuracy of the micro light-emitting diode may be improved according to one embodiment.

Optionally, the capacitor group 200 corresponding to each micro light-emitting diode 20 may include two first capacitors and two second capacitors. The four capacitors may be arranged corresponding to the four corners of the micro light-emitting diode 20, respectively. In such way, the influence of the conductive layer of the micro light-emitting diode itself on the capacitor group may be avoided, so that the influence on the light-emitting of the micro light-emitting diode may be avoided; furthermore, all regions of the micro light-emitting diode may be detected.

Optionally, the dotted lines in FIG. 12 indicates that in the same capacitor group: the first A electrodes may be electrically connected to each other through leads, the first B electrode may be electrically connected to each other through leads, the second A electrodes may be electrically connected to each other through leads, and the second B electrodes may be electrically connected to each other through leads.

Figure 14:
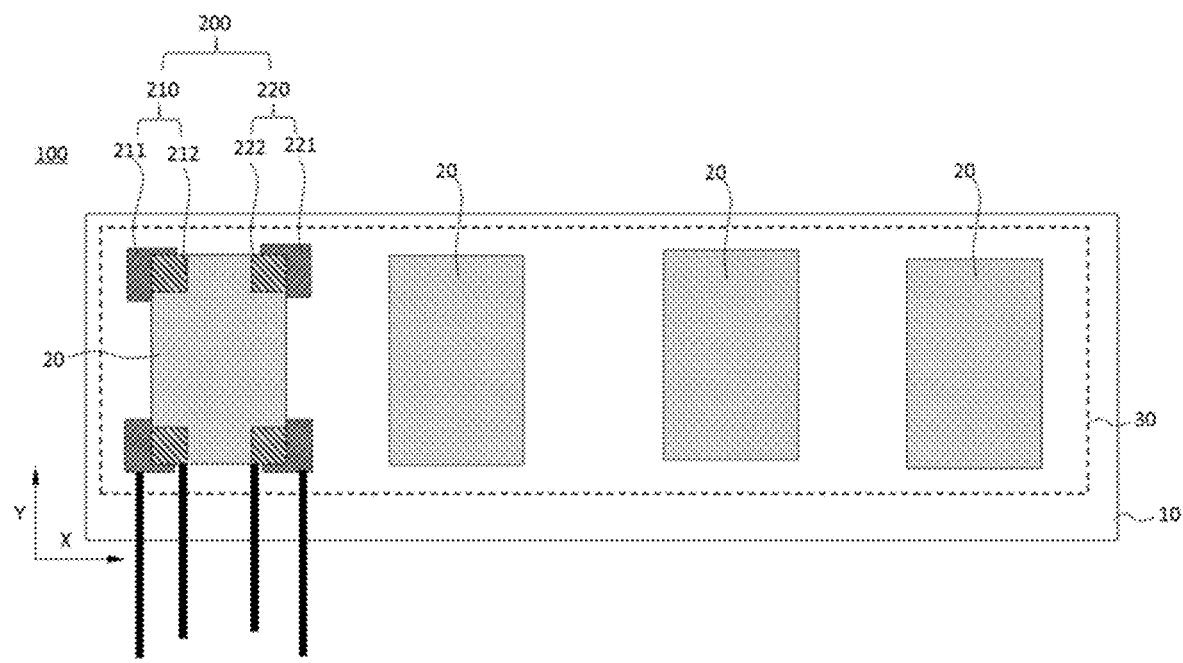
FIG. 14 illustrates a top view of another panel structure according to various embodiments of the present disclosure.

Referring to FIG. 14, FIG. 14 illustrates a top view of another panel structure according to various embodiments of the present disclosure. Different from the above-mentioned embodiments, the panel structure 100 may include a plurality of micro light-emitting diodes 20 arranged in an array. N micro light-emitting diodes 20 may be formed into a micro light-emitting diode group 30, and M micro light-emitting diodes in the micro light-emitting diode group 30 may be correspondingly provided with the capacitor group 200, where M<N. That is, the micro light-emitting diode group 30 with N micro light-emitting diodes 20 may be provided with M capacitor groups 200, correspondingly. In other words, the quantity of capacitor groups 200 corresponding to a certain micro light-emitting diode group 30 may be less than the quantity of micro light-emitting diodes 20 in the micro light-emitting diode group 30. For example, in one embodiment, N=4 and M=1.

Optionally, one micro light-emitting diode group 30 may be provided with one capacitor group 200, correspondingly, where the first B electrode 212 and the second B electrode 222 may be arranged on a same micro light-emitting diode 20.

The line space is limited for certain display panels with high pixel density, and it may be difficult to adjust the position of each micro light-emitting diode under actual conditions. In one embodiment, for example, for the light-emitting diodes arranged in an array, 10*10 (quantity) of micro light-emitting diodes may be selected as a micro light-emitting diode group, and a corresponding capacitor group may be disposed correspondingly; and the overall adjustment may be performed for the 10*10 micro light-emitting diodes (e.g., the micro light-emitting diode group) each time. The micro light-emitting diodes in the same micro light-emitting diode group may be transported together, such that the micro light-emitting diodes in the same micro light-emitting diode group may have the same deviation situation. Therefore, the deviation situations of all of the micro light-emitting diodes in the same micro light-emitting diode group may be determined according to the detection result of one micro light-emitting diode in the same group of micro light-emitting diodes, thereby improving efficiency, reducing the space occupied by the capacitors and wires, and reducing the cost.

Figure 15:
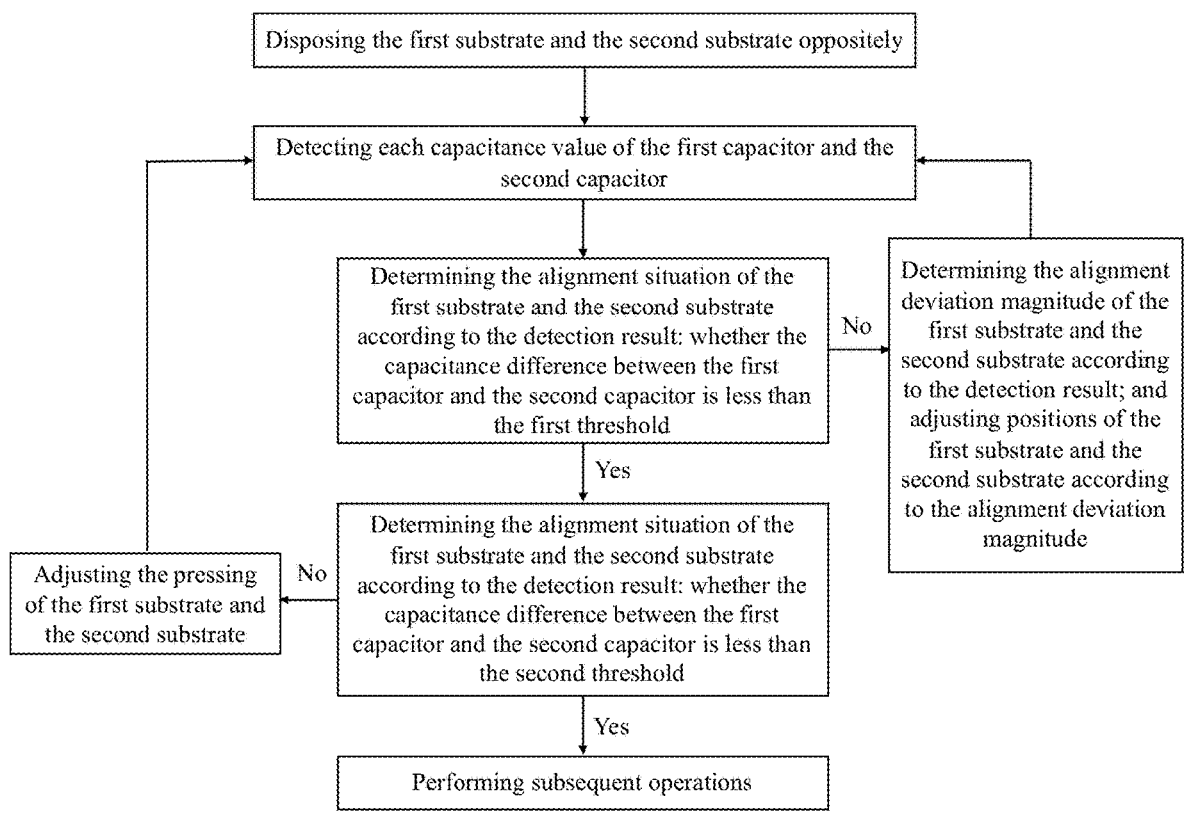
FIG. 15 illustrates a flowchart of an alignment detection method according to various embodiments of the present disclosure.

Referring to the drawings of the above-mentioned embodiments and FIG. 15, FIG. 15 illustrates a flowchart of an alignment detection method according to various embodiments of the present disclosure.

The present disclosure further provides an alignment detection method for detecting the alignment situations of the panel structures in various above-mentioned embodiments. For example, the first substrate 110 and the second substrate 120 may be disposed opposite to each other, that is, the first substrate 110 and the second substrate 120 may be aligned for the first time. The capacitance value of the first capacitor 210 and the capacitance value of the second capacitor 220 may be detected; the alignment situation of the first substrate 110 and the second substrate 120 may be determined according to the detection result; and the principle and analysis may refer to the above-mentioned related description, which may not be described in detail herein.

Optionally, when the actual detected capacitance value of the first capacitor exceeds the range (1+5%) of the capacitance value of the first capacitor being correctly aligned theoretically, the occurred planar alignment error may be determined. That is, the leads of the capacitor group may be led out to the measurable position of the machine. According to the existing capacitance related parameters, the designed capacitance value may be computed, and then be compared with the measured capacitance value. If the two values are equal to each other or the deviation of the two values is within a certain range, the alignment may be determined as accurate. Same principle may be applied to the second capacitor, which may not be described in detail herein. In such way, the accuracy of the detection result may be verified mutually by the first capacitor and the second capacitor.

Optionally, the determination of the alignment situation of the first substrate and the second substrate according to the detection result may include the following.

When the capacitance difference between the first capacitor and the second capacitor is less than a first threshold, it is determined that other subsequent operations may be performed; and when the capacitance difference between the first capacitor and the second capacitor is greater than a first threshold, it is determined that the alignment of the first substrate and the second substrate need to be adjusted; where the first threshold may be a theoretical capacitance difference that meets the planar alignment requirement.

For example, "meet the planar alignment requirement" may indicate that the alignment deviation meets the requirement that the alignment deviation is not greater than "the allowable alignment deviation between the first substrate and the second substrate along the plane in parallel with the panel structure within an allowable error range". The first threshold may be the maximum value of the theoretically allowed difference between the first capacitor and the second capacitor when the above-mentioned requirement is met. When the above-mentioned requirement is met, the actual detected capacitance difference between the first capacitor and the second capacitor may not be greater than the first threshold. Therefore, the detected capacitance value of the first capacitor and the detected capacitance value of the second capacitor may be subjected to difference (e.g., subtraction) processing to obtain the actual capacitance difference. The actual capacitance difference is compared with the first threshold. If the actual capacitance difference is less than the first threshold, it may indicate that the alignment along the plane in parallel with the panel structure is qualified, the position of the first substrate relative to the second substrate along the above-mentioned plane may not need to be adjusted, and other operations may be performed subsequently. If the actual capacitance difference is greater than the first threshold, it may indicate that the alignment along the plane in parallel with the panel structure is not qualified, the position of the first substrate relative to the second substrate along the above-mentioned plane may need to be adjusted, and then the step of "detecting the capacitance value of the first capacitor and the capacitance value of the second capacitor; and determining the alignment situation of the first substrate and the second substrate according to the detection result" may be proceeded till "the actual capacitance difference is less than the first threshold" is satisfied.

It should be noted that the planar alignment mentioned in the present application may refer to the alignment adjustment performed by the relative movement of the first substrate and the second substrate along the direction in parallel with the plane of the panel structure.

Optionally, the alignment detection method provided by the present application further includes, after "when the capacitance difference between the first capacitor and the second capacitor is less than the first threshold, it is determined that other subsequent operations may be performed", determining whether the detection result is less than a second threshold, where:

when the detection result is less than the second threshold, other subsequent operations may be performed; and when the detection result is greater than the second threshold, the pressing of the first substrate and the second substrate may be adjusted, where the second threshold may be a theoretical capacitance difference that meets the bonding requirement along the vertical direction.

For example, after the bonding and alignment, the first substrate and the second substrate may have different bonding tightness in different areas due to problems including uneven pressing. For example, certain areas may be warped and not bonded, resulting in uneven regions. Therefore, for the first capacitor and the second capacitor, the above-mentioned problems may lead to the differences between corresponding situations of actual dielectric and the vertical distance between the electrodes in the capacitor with above-mentioned problems, and corresponding situations of the dielectric and the vertical distance between the electrodes in the capacitor without the above problems, respectively. Therefore, the actual capacitance difference between the first capacitor and the second capacitor may be different from the theoretical capacitance difference. In one embodiment, "the theoretical capacitance difference that meets the bonding requirement along the vertical direction" may be the allowable maximum value (e.g., the second threshold) of the difference between the first capacitor and the second capacitor within the allowable error range when the above-mentioned problem does not occur along the vertical direction. In order to improve the above-mentioned problems, the actual detected capacitance difference between the first capacitor and the second capacitor may not be greater than the second threshold. Therefore, the detected capacitance value of the first capacitor and the capacitance value of the second capacitor may be subjected to difference (e.g., subtraction) processing to obtain the actual capacitance difference. The actual capacitance difference is compared with the second threshold. If the actual capacitance difference is less than the second threshold, it may indicate that the alignment along the plane perpendicular to the panel structure is qualified, and other subsequent operations may be performed. If the actual capacitance difference is greater than the second threshold, it may indicate that the alignment along the plane perpendicular to the panel structure is not qualified, the first substrate and the second substrate may be pressed for adjustment, and then the step of "detecting the capacitance value of the first capacitor and the capacitance value of the second capacitor; and determining the alignment situation of the first substrate and the second substrate according to the detection result" may be proceeded till "the actual capacitance difference is less than the second threshold" is satisfied.

It should be noted that the "bonding along the vertical direction" in one embodiment may refer to moving the first substrate and the second substrate along the direction perpendicular to the plane of the panel structure to adjust the pressing.

It can be understood that the error along the vertical direction and the error along the horizontal direction are not of the same magnitude order, so that the second threshold may be less than the first threshold.

According to one embodiment, not only the horizontal alignment deviation may be detected, but also the vertical alignment deviation may be detected, which provides multiple maintenance deviation detection to improve detection efficiency.

Optionally, the alignment detection method provided in the present application further includes:

determining the alignment deviation magnitude of the first substrate and the second substrate according to the detection result; and after it is determined that the alignment of the first substrate and the second substrate needs to be adjusted when the capacitance difference between the first capacitor and the second capacitor is greater than the first threshold, adjusting positions of the first substrate and the second substrate according to the deviation magnitude.

Optionally, a calculation method for the deviation magnitude may also be provided in one embodiment. For example, the deviation magnitude $\Delta x=[p*(C1-C2)]/(C1 C2)$, where $\Delta x$ is the alignment deviation magnitude between the first substrate 110 and the second substrate 120 along the direction in parallel with the first direction X. C1 is the detected capacitance value of the first capacitor 210, C2 is the detected capacitance value of the second capacitor 220, and p is the overlapping dimension of the first A electrode 211 and the first B electrode 212 in the first capacitor 210 along the first direction when being accurately aligned, theoretically. In addition, the overlapping dimension, along the first direction, of the second A electrode 221 and the second B electrode 222 in the second capacitor 220 may also be p. Optionally, along the first direction, the overlapping dimension of the first A electrode 211 and the first B electrode 212 in the first capacitor 210 may be same as the overlapping dimension of the second A electrode 221 and the second B electrode 222 in the second capacitor 220. Optionally, along the second direction Y, the dimensions of the first B electrode 212 and the second B electrode 222 may be same (both assuming to be a), and the dimensions of the first A electrode 211 and the second A electrode 221 may be same. The first direction X and the second direction Y may be perpendicular to each other, but may both be in parallel with the plane where the panel structure 100 is located.

The capacitance value of the capacitor is $C=\varepsilon S/d$. ($\varepsilon$ is the dielectric constant of the medium between the plates, S is the area of the plates, and d is the distance between the plates), such that, when deviating along the first direction, the changing trends of the first capacitor and the second capacitor may be exactly opposite, and the changing magnitudes may be the same. Therefore, the increasing magnitude in the first capacitor is the decreasing magnitude in the second capacitor, and the detection range of C1+C2 in the capacitor group may not change with the displacement deviation. With reference to the embodiment in FIG. 1, the capacitance values of the first capacitor and the second capacitor value may be same when the substrates are correctly aligned.

Then, $C1+C2=2\varepsilon S/d=2\varepsilon a*p/d$;

$C1-C2=\varepsilon*(S1-S2)/d=\varepsilon[a*(p+\Delta x)-a*(p-\Delta x)]/d=\varepsilon a*2\Delta x/d$;

then, $(C1-C2/(C1+C2)=(\varepsilon a*2\Delta x/d)/(2\varepsilon a*p/d)=\Delta x/p$;

therefore, $\Delta x=[p*(C1-C2)]/(C1+C2)$.

According to one embodiment, not only the detection accuracy and detection sensitivity may be improved, but also the alignment deviation may be directly obtained to improve the alignment efficiency.

Furthermore, it should be noted that $C1*C2\neq 0$ because when $C1*C2=0$, it indicates that one of the first capacitor and the second capacitor is 0, indicating that there is no overlapping between the class A electrode and the class B electrode in the capacitor. Such situation may indicate that there is a large alignment deviation which may first be directly adjusted using the camera observation.

Optionally, before detecting the capacitance value of the first capacitor 210 and the capacitance value of the second capacitor 220, the method further includes detecting the alignment situation of the first substrate 110 and the second substrate 120 through the camera. For example, the positional relationship between the first A electrode 211 and the first B electrode 212 and the positional relationship between the second A electrode 221 and the second B electrode 222 may be photographed and observed through the lenses (e.g., charge coupled device (CCD)) of the camera. If it is observed that "the first A electrode 211 does not overlap the first B electrode 212, or the electrode in the first capacitor overlaps the electrode in the second capacitor, or the first A electrode 211 and the first B electrode 212 are misaligned along the second direction Y that may affect the first capacitance change", the positions of the first substrate 110 and the second substrate 120 may be adjusted. For example, the alignment machine or the alignment parameters may be adjusted, and then the first substrate 110 and the second substrate 120 may be re-aligned. The above-mentioned "detecting the alignment situation of the first substrate 110 and the second substrate 120 by the camera" may be repeated. Until there is no situation that "the first A electrode 211 does not overlap the first B electrode 212, or the electrode in the first capacitor overlaps the electrode in the second capacitor, or the first A electrode 211 and the first B electrode 212 are misaligned along the second direction Y that may affect the first capacitance change", then, "detecting the capacitance value of the first capacitor and the capacitance value of the second capacitor; and determining the alignment situation of the first substrate and the second substrate according to the detection result" may be performed. It should be understood that the above-mentioned "the first A electrode 211 and the first B electrode 212 are misaligned along the second direction Y that may affect the first capacitance change" may be, for example, the dimension of the first A electrode 211 may be larger than the dimension of the first B second electrode 212 along the second direction Y; when correctly aligned, the first A electrode 211 may cover the first B electrode 212 along the second direction Y, but, when the camera captures that the first B electrode 212 exceeds the coverage range of the first A electrode along the second direction Y, the position deviation along the second direction Y may affect the alignment deviation situation along the first direction X detected by the first capacitor.

According to one embodiment, the situation that "the first A electrode 211 does not overlap the first B electrode 212 do not overlap, or the electrode in the first capacitor overlaps the electrode in the second capacitor, or the first A electrode 211 and the first B electrode 212 are misaligned along the second direction Y that may affect the first capacitance change" may be relatively obvious to be observed, which is more suitable for camera observation, but such type of case may adversely affect the detection of the capacitor group. Therefore, according to one embodiment, two detection manners may be combined to avoid mis-operation; and such two adapted detection manners, with the specific and selective combination of the structures of the present disclosure, may further improve the efficiency and reliability of the alignment detection.

Figure 16:
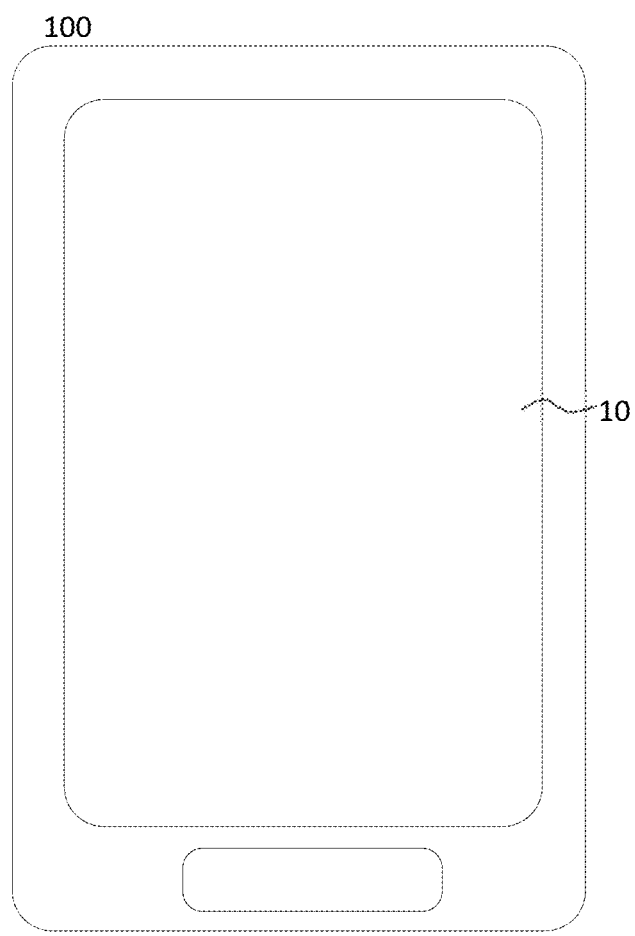
FIG. 16 illustrates a structural schematic of a display device according to various embodiments of the present disclosure.

The present disclosure also provides a display device including the display panel provided by the present disclosure. Referring to FIG. 16, FIG. 16 illustrates a structural schematic of a display device according to various embodiments of the present disclosure. A display device 1000 may include a panel structure 100 provided by any of the above-mentioned embodiments of the present disclosure. A mobile phone may be taken as an example to illustrate the display device 1000 in one embodiment of FIG. 16. It can be understood that the display device provided by the embodiments of the present disclosure may be a computer, a television, a vehicle-mounted display device, and other display devices with a display function, which may not be limited according to the embodiments of the present disclosure. The display device provided by the embodiments of the present disclosure may have the beneficial effects of the display panel provided by the embodiments of the present disclosure. Details may refer to the description of the display panel in the above-mentioned embodiments, which may not be described in detail herein.

In this manner, the sensitivity and accuracy of the alignment detection of the panel structure can be improved. The direction of the alignment deviation can also be obtained, which provides the reference to the alignment adjustment and the alignment efficiency can be improved.

Although certain embodiments of the present disclosure have been described in detail through examples, those skilled in the art should understand that the above-mentioned examples are merely for illustration and not for limiting the scope of the present disclosure. Those skilled in the art should understand that the above-mentioned embodiments may be modified without departing from the scope and spirit of the present disclosure, and the scope of the present disclosure is defined by the appended claims.

What is claimed is:

1. A panel structure, comprising:
   a first substrate and a second substrate, oppositely disposed; and
   a capacitor group, including a first capacitor and a second capacitor, wherein:
   the first capacitor includes a first A electrode and a first B electrode, oppositely disposed;
   the second capacitor includes a second A electrode and a second B electrode, oppositely disposed;
   the first A electrode and the second A electrode are on the first substrate, and the first B electrode and the second B electrode are on the second substrate; and
   the first B electrode is misaligned with the first A electrode along a first direction; and the second B electrode is misaligned with the second A electrode along an opposite direction of the first direction.

2. The panel structure according to claim 1, wherein:
   an arrangement direction of the first capacitor and the second capacitor is in parallel with the first direction;
   a spacing between the first A electrode and the second A electrode is a first spacing;
   a spacing between the first B electrode and the second B electrode is a second spacing; and
   an orthographic projection of the second spacing on a plane of the panel structure is within an orthographic projection of the first spacing on the plane of the panel structure.

3. The panel structure according to claim 1, wherein:
   an arrangement direction of the first capacitor and the second capacitor is in parallel with the first direction; and
   when the first capacitor and the second capacitor are disposed symmetrically, a capacitance value of the first capacitor is equal to a capacitance value of the second capacitor.

4. The panel structure according to claim 1, wherein:
   along the first direction:
   a spacing distance between the first A electrode and the second A electrode is D1, and a spacing distance between the first B electrode and the second B electrode is D2, wherein D1>D2; and
   a length of the first B electrode is d1, and a length of the second B electrode is d2, wherein D1>d1 and D1>d2.

5. The panel structure according to claim 4, wherein along the first direction:
   the length of the first B electrode is equal to the length of the second B electrode, both lengths being d, wherein d+D2=D1.

6. The panel structure according to claim 1, wherein along a second direction:
   lengths of the first A electrode and the first B electrode are different; and/or, lengths of the second A electrode and the second B electrode are different, wherein the second direction intersects the first direction.

7. The panel structure according to claim 6, wherein along the second direction:
   the length of the first A electrode is less than the length of the first B electrode; and/or
   the length of the second A electrode is less than the length of the second B electrode.

8. The panel structure according to claim 1, further including:
   a dielectric layer, wherein the dielectric layer is at least between the first A electrode and the first B electrode and between the second A electrode and the second B electrode; and the dielectric layer includes a first region and second regions on at least two opposite sides of the first region along the first direction, wherein:
   a spacing between the first A electrode and the second A electrode is a first spacing;
   a spacing between the first B electrode and the second B electrode is a second spacing; and
   when the second spacing displaces within a range of the first spacing along a direction in parallel with the first direction,
   a boundary between the first region and a second region falls within an overlapping region of the first A electrode and the first B electrode and is displaced relative to one of the first A electrode and the first B electrode; and/or the boundary between the first region and the second region falls within the overlapping region of the second A electrode and the second B electrode and is displaced relative to one of the second A electrode and the second B electrode, wherein a dielectric constant of the first region is ε1, a dielectric constant of the second region is ε2, and ε1<ε2.

9. The panel structure according to claim 1, wherein:
the capacitor group includes:
a plurality of first capacitors arranged along the first direction, wherein in a same capacitor group, a plurality of first A electrodes is electrically connected to each other, and a plurality of first B electrodes is electrically connected to each other; and the first capacitor is a strip capacitor having a width direction in parallel with the first direction; and/or
a plurality of second capacitors arranged along the first direction, wherein in a same capacitor group, a plurality of second A electrodes is electrically connected to each other, and a plurality of second B electrodes is electrically connected to each other; and the second capacitor is a strip capacitor having a width direction in parallel with the first direction.

10. The panel structure according to claim 1, wherein:
one of the first A electrode and the first B electrode is a mesh electrode; and/or,
one of the second A electrode and the second B electrode is a mesh electrode.

11. The panel structure according to claim 1, further including:
a plurality of capacitor groups, wherein misalignment directions in at least two capacitor groups are different.

12. The panel structure according to claim 1, wherein:
a capacitor in the capacitor group is circular or semi-circular.

13. The panel structure according to claim 1, wherein:
the first A electrode and the second A electrode are at different layers.

14. The panel structure according to claim 1, wherein:
the panel structure is a micro light-emitting diode display panel; the first substrate is an array substrate; and the second substrate includes micro light-emitting diodes.

15. The panel structure according to claim 14, wherein:
the panel structure includes a plurality of micro light-emitting diodes arranged in an array; N micro light-emitting diodes are formed into a micro light-emitting diode group; and the capacitor group is disposed at M micro light-emitting diodes in one micro light-emitting diode group, wherein M<N.

16. A display panel, wherein:
the display panel includes a panel structure, the panel structure including:
a first substrate and a second substrate, oppositely disposed; and
a capacitor group, including a first capacitor and a second capacitor, wherein:
the first capacitor includes a first A electrode and a first B electrode, oppositely disposed;
the second capacitor includes a second A electrode and a second B electrode, oppositely disposed;
the first A electrode and the second A electrode are on the first substrate, and the first B electrode and the second B electrode are on the second substrate; and the first B electrode is misaligned with the first A electrode along a first direction; and the second B electrode is misaligned with the second A electrode along an opposite direction of the first direction.

17. An alignment detection method of a panel structure, comprising:
providing the panel structure including:
a first substrate and a second substrate, oppositely disposed; and
a capacitor group, including a first capacitor and a second capacitor, wherein:
the first capacitor includes a first A electrode and a first B electrode, oppositely disposed;
the second capacitor includes a second A electrode and a second B electrode, oppositely disposed;
the first A electrode and the second A electrode are on the first substrate, and the first B electrode and the second B electrode are on the second substrate; and
the first B electrode is misaligned with the first A electrode along a first direction; and the second B electrode is misaligned with the second A electrode along an opposite direction of the first direction; and
detecting each capacitance value of the first capacitor and the second capacitor; and
determining an alignment situation of the first substrate and the second substrate according to a detection result.

18. The method according to claim 17, wherein determining the alignment situation of the first substrate and the second substrate according to the detection result includes:
when a capacitance difference between the first capacitor and the second capacitor is less than a first threshold, determining to perform subsequent operations; and
when the capacitance difference between the first capacitor and the second capacitor is greater than the first threshold, determining that an alignment of the first substrate and the second substrate needs to be adjusted, wherein the first threshold is a theoretical capacitance difference that meets a planar alignment requirement.

19. The method according to claim 18, further including:
determining an alignment deviation magnitude of the first substrate and the second substrate according to the detection result; and
adjusting positions of the first substrate and the second substrate according to the alignment deviation magnitude after determining that the alignment of the first substrate and the second substrate needs to be aligned.

20. The method according to claim 18, wherein:
after determining to perform the subsequent operations, determining whether the capacitance difference between the first capacitor and the second capacitor is less than a second threshold, wherein:
when the capacitance difference between the first capacitor and the second capacitor is less than the second threshold, determining to perform other subsequent operations; and
when the capacitance difference between the first capacitor and the second capacitor is greater than the second threshold, adjusting a pressing of the first substrate and the second substrate, wherein the second threshold is a theoretical capacitance difference that meets a bonding requirement along a vertical direction.

* * * * *